United States Patent [19]
Sasaki et al.

[11] Patent Number: 5,861,675
[45] Date of Patent: Jan. 19, 1999

[54] SEMICONDUCTOR DEVICE HAVING WNF FILM AND METHOD OF MANUFACTURING SUCH A DEVICE

[75] Inventors: Keiichi Sasaki, Yokohama; Iwao Kunishima, Kawasaki, both of Japan

[73] Assignee: Kabushiki Kaisha Toshiba, Kawasaki, Japan

[21] Appl. No.: 996,401

[22] Filed: Dec. 22, 1997

[30]    Foreign Application Priority Data

Dec. 26, 1996  [JP]  Japan .................................. 8-357185

[51] Int. Cl.⁶ ........................... H01L 23/48; H01L 23/52; H01L 29/40
[52] U.S. Cl. ............................. 257/764; 257/751
[58] Field of Search .................... 257/764, 763, 257/751, 767; 438/648, 653, 656, 685

[56]         References Cited

U.S. PATENT DOCUMENTS

| | | | |
|---|---|---|---|
| 4,746,219 | 5/1988 | Holloway et al. | 257/763 |
| 5,221,853 | 6/1993 | Joshi et al. | 257/764 |
| 5,280,190 | 1/1994 | Lu | 257/763 |
| 5,661,334 | 8/1997 | Akram . | |
| 5,760,475 | 6/1998 | Cronin et al. | 257/763 |

FOREIGN PATENT DOCUMENTS 5-129231   5/1993   Japan .

*Primary Examiner*—Mahshid D. Saadat
*Assistant Examiner*—S. V. Clark
*Attorney, Agent, or Firm*—Finnegan, Henderson, Farabow, Garrett & Dunner, L.L.P.

[57]           ABSTRACT

The tungsten nitride film containing fluorine is used as a barrier metal in the contact hole or via hole of the semiconductor device. The tungsten nitride film formed contains 1% to 20% fluorine at atomic density. With this structure, it is possible to obtain a WNF film having a good step coverage for a fine hole.

23 Claims, 12 Drawing Sheets

SEMICONDUCTOR DEVICE HAVING WNF FILM AND METHOD OF MANUFACTURING SUCH A DEVICE

BACKGROUND OF THE INVENTION

The present invention relates to a semiconductor device having a tungsten nitride film containing fluorine (WNF film).

Recently, there is a great demand for a highly reliable multilayer wiring technique capable of forming via holes, contact holes or fine wires, which have high aspect ratios, so as to achieve a high integration of LSI. For example, conventionally, chemical vapor deposition methods have been proposed as a technique for burying a wire having a high aspect ratio, a typical one of which is blanket W-CVD using tungsten hexafluoride ($WF_6$) and hydrogen ($H_2$).

However, with the blanket W-CVD, a good adhesion with respect to the underlayer of Si or oxide film, cannot be obtained, and therefore it is required to provide a metal adhesion layer such as of titanium nitride, tantalum nitride (TaN), tungsten titanium or tungsten nitride, between the underlayer and W. Conventionally, such a metal adhesion layer is formed by the sputtering or reactive sputtering technique; however it is preferable that a CVD method having a high step coverage should be employed when applied to fine via holes or contact holes.

Further, conventionally, for wires made of low-resistance materials such as Al and Cu, a metal adhesion layer made of, typically, TiN is used as a diffusion barrier; however recently there is an increasing demand for a CVD method having a high step coverage, as the size of the wiring portion becomes finer.

In the case where a TiN film is formed by the CVD method, the film is formed with use of titanium chloride ($TiCl_4$) and ammonium ($NH_3$); however these materials cannot be used after the formation of the aluminum wire since the temperature for the formation of the film is as high as 600° C. or higher. Further, chlorine remains as residue in the film, and therefore the corrosion of the wire easily occurs. Furthermore, the formation of a TiN film with use of a Ti-based organic metal gas and ammonium is presently studied; however it entails the problem of an increase in resistance, caused by impurities or moisture absorption, and therefore has not yet been established as a film forming method.

As described, the formation of a TiN, TaN or TiW film with use of the CVD method, entails a number of drawbacks to be solved.

In the meantime, the formation of tungsten nitride film containing fluorine (WNF film), using material gases of $WF_6$ and $NH_3$, is also studied. The WNF film is thermally stable, and it can be formed at a low substrate temperature of 600° C. or less by a vacuum CVD method. Therefore, the use of the film as an adhesion layer for Mo, or a barrier layer for an Al or Cu wire is studied.

However, the WNF film made by the conventional vacuum CVD method using $WF_6$ and $NH_3$, entails the problems of a poor step coverage and a high film stress. One of the factors which create such problems is considered that the content of fluorine in the WNF film is low. Therefore, the WNF film made by the conventional vacuum CVD method using $WF_6$ and $NH_3$, should not be appropriate as an adhesion layer, barrier layer or the like, in a fine hole.

BRIEF SUMMARY OF THE INVENTION

Accordingly, it is an object of the present invention to provide a semiconductor device having a WNF film exhibiting an excellent adhesion to an underlayer and a step coverage in a fine hole, which can be easily formed at low temperature by use of a CVD method, and a method of manufacturing such a device.

According to one aspect of the present invention, there is provided a semiconductor device comprising: a first conductive layer: an insulating layer in which a hole section which is made through to the first conductive layer; and a second conductive layer formed in the hole section, at least a part of the second conductive layer being made of a tungsten nitride film containing fluorine at an atomic density of 1% to 20%.

In this device, it is more desirable that the atomic density of fluorine contained the tungsten nitride film is 1% to 5%.

The tungsten nitride film used for the formation of the second conductive layer may be formed such as to cover a surface of the hole section.

The second conductive layer may be made of the tungsten nitride film and a metal film formed on the tungsten nitride film. The metal film may be made of a tungsten film, for example.

According to another aspect of the present invention, there is provided a semiconductor device comprising: a first conductive layer formed on a main surface of a semiconductor substrate, and constituting a source-drain diffusion layer of a MOS transistor; an insulating layer formed on the main surface of the semiconductor substrate, and having a hole section which is made through to the first conductive layer; a second conductive layer formed in the hole section, a lower portion of the second conductive layer being connected to the first conductive layer, at least a part of the second conductive layer being made of a tungsten nitride film containing fluorine at an atomic density of 1% to 20%; and a third conductive layer connected to an upper portion of the second conductive layer, and constituting an electrode or a wire.

According to another aspect of the present invention, there is provided a semiconductor device comprising: a first conductive layer formed on a main surface of a semiconductor substrate, and constituting a source-drain diffusion layer of a MOS transistor; an insulating layer formed on the main surface of the semiconductor substrate, and having a hole section which is made through to the first conductive layer, and a groove section connected to the hole section; a second conductive layer formed in the hole section, a lower portion of the second conductive layer being connected to the first conductive layer; and a third conductive layer formed in the groove section, and connected to an upper portion of the second conductive layer, such as to constitute a wiring, wherein at least a part of the second conductive layer and a part of the third conductive layer being made of a tungsten nitride film containing fluorine at an atomic density of 1% to 20%.

According to another aspect of the present invention, there is provided a semiconductor device comprising: a first insulating film formed on a main surface of a semiconductor substrate having a MOS transistor; a first conductive layer formed on an upper side of the first insulating film, and constituting a first wiring; a second insulating film formed on the upper side of the first insulating film and the first conductive film, and having a hole section which is made through to the first conductive layer; a second conductive layer formed in the hole section, a lower portion of the second conductive layer being connected to the first conductive layer, at least a part of the second conductive layer being made of a tungsten nitride film containing fluorine at an atomic density of 1% to 20%; and a third conductive layer connected to an upper portion of the second conductive layer, and constituting a second wiring.

According to another aspect of the present invention, there is provided a semiconductor device comprising: a first insulating film formed on a main surface of a semiconductor substrate having a MOS transistor; a first conductive layer formed on an upper side of the first insulating film, and constituting a first wiring; a second insulating film formed on the upper side of the first insulating film and the first conductive film, and having a hole section which is made through to the first conductive layer, and a groove section connected to the hole section; a second conductive layer formed in the hole section, a lower portion of the second conductive layer being connected to the first conductive layer; and a third conductive layer formed in the groove section, and connected to an upper portion of the second conductive layer, such as to constitute a second wiring, wherein at least a part of the second conductive layer and a part of the third conductive layer being made of a tungsten nitride film containing fluorine at an atomic density of 1% to 20%.

According to another aspect of the present invention, there is provided a method of manufacturing a semiconductor device including a first conductive layer, an insulating layer having a hole section made through to the first conductive layer, and a second conductive layer formed in the hole section and made of a tungsten nitride film containing fluorine, in a reaction chamber to which a first gas containing tungsten and halogen element, and a second gas containing nitrogen are introduced, comprising the steps of: setting a flow amount Q1 of the first gas to 10 to 1000 cc/min, a flow amount Q2 of the second gas to 10 to 1000 cc/min, and a flow amount ratio between the first and second gases to $Q1/Q2 \geq \frac{1}{2}$; and supplying the first and second gases, the flow amount of each of which is controlled, into the hole section, thereby forming the tungsten nitride film containing fluorine, by a chemical vapor deposition method.

In this method, during the formation of the tungsten nitride film by the chemical vapor deposition method, the flow amount ratio may be set to $Q1/Q2 \geq \frac{1}{2}$ when a temperature of a subject to be processed is in a range of 250° C. to 400° C., and the flow amount ratio may be set to $Q1/Q2 \geq 1$ when a temperature of a subject to be processed is in a range of 400° C. to 600° C. More preferably, during the formation of the tungsten nitride film by the chemical vapor deposition method, the flow amount ratio may be set to $Q1/Q2 \geq 1$ when a temperature of a subject to be processed is in a range of 250° C. to 400° C., and the flow amount ratio may be set to $Q1/Q2 \geq 2$ when a temperature of a subject to be processed is in a range of 400° C. to 600° C.

The tungsten nitride film used for the formation of the second conductive layer may be formed such as to cover a surface of the hole section.

The second conductive layer may be made of the tungsten nitride film and a metal film formed on the tungsten nitride film. The metal film may be made of a tungsten film, for example.

The first gas may contain $WF_6$, for example. The second gas may contain at least one of ammonium, hydrazine and an alkylazide compound, for example.

During the formation of the tungsten nitride film by the chemical vapor deposition method, inorganic silane gas may be also introduced to the reaction chamber.

Also, during the formation of the tungsten nitride film by the chemical vapor deposition method, a carrier gas which assists the reduction of the first gas may be also introduced to the reaction chamber.

According to another aspect of the present invention, there is provided a method of manufacturing a semiconductor device including a first conductive layer, an insulating layer having a hole section made through to the first conductive layer, and a second conductive layer formed in the hole section and made of a tungsten nitride film containing fluorine, in a reaction chamber to which a first gas containing tungsten and halogen element, and a second gas containing nitrogen are introduced, comprising the steps of: rotating a substrate to be processed, placed in the reaction chamber; setting a flow amount Q1 of the first gas to 10 to 1000 cc/min, a flow amount Q2 of the second gas to 10 to 1000 cc/min, and a flow amount ratio between the first and second gases to $Q1/Q2 \geq \frac{1}{4}$; and supplying the first and second gases, the flow amount of each of which is controlled, into the hole section, thereby forming the tungsten nitride film containing fluorine, by a chemical vapor deposition method.

In this method, a rotation speed for rotating the substrate to be processed, may be set to 500 rpm or higher.

During the formation of the tungsten nitride film by the chemical vapor deposition method, the flow amount ratio may be set to $Q1/Q2 \geq \frac{1}{4}$ when a temperature of a subject to be processed is in a range of 250° C. to 400° C., and the flow amount ratio may be set to $Q1/Q2 \geq \frac{1}{2}$ when a temperature of a subject to be processed is in a range of 400° C. to 600° C. More preferably, during the formation of the tungsten nitride film by the chemical vapor deposition method, the flow amount ratio may be set to $Q1/Q2 \geq \frac{1}{2}$ when a temperature of a subject to be processed is in a range of 250° C. to 400° C., and the flow amount ratio may be set to $Q1/Q2 \geq 1$ when a temperature of a subject to be processed is in a range of 400° C. to 600° C.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

Embodiments of the present invention will now be described in detail with reference to accompanying drawings.

First, a first example of the structure of the film forming apparatus used in the present invention and the film formation properties obtained by the apparatus, and the like will now be described.

Figure 1:
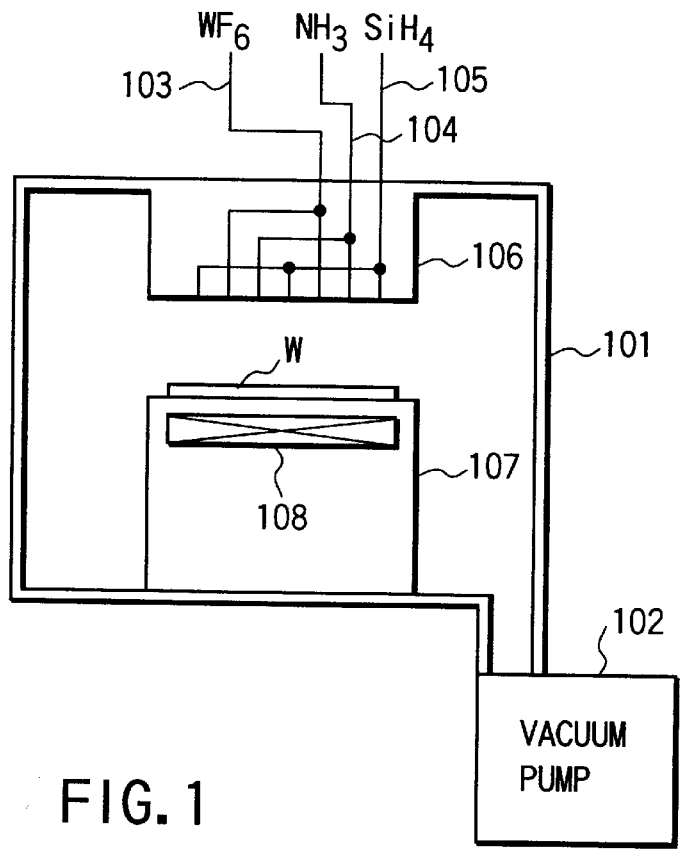
FIG. 1 is a block diagram illustrating the first example of the structure of the film forming apparatus according to the present invention.

FIG. 1 is a schematic block diagram briefly showing a leaf-type reduced-pressure (vacuum) thermal CVD apparatus according to the first example of the structure of the apparatus.

As can be seen in the figure, to a reaction chamber 101, a vacuum pump 102 and raw material gas supply pipes 103, 104 and 105 are connected. $WF_6$, $NH_3$ and $SiH_4$ are supplied selectively to the material gas supply pipes 103, 104 and 105, respectively, when necessary. These material gases are supplied to the chamber 101 via a dispersion disk 106 for dispersing gas to supply it onto a wafer W. A susceptor 107 is provided within the chamber 101, and a resistance heating-type heater 108 is built in the susceptor 107. A wafer W is held on the susceptor 107, and it is heated with the resistance heating-type heater 108.

The material gases, namely, $WF_6$, $NH_3$ and $SiH_4$, are introduced to the chamber 101 as the flow amount of each of them is controlled by a respective mass flow controller, which is not shown. Further, the chamber 101 and the vacuum pump 102, themselves, have a structure capable of being heated such that a reaction product generated while the formation of film, cannot adhere to the internal structure thereof, and they can be heated within a temperature range of 100° C. to 200° C.

In the case of forming a tungsten nitride film (WNF film), which contains nitrogen, a wafer W is held on the susceptor 107, and the material gases, $WF_6$ and $NH_3$ are introduced to the chamber 101 while keeping the temperature of the substrate at 600° C. or less, preferably, in a range of 250° C. to 500° C., by the resistance heating type heater 108. Then, a film is formed under conditions that, for example, the flow amount of $WF_6$ is set to 60 sccm, and the flow amount of $NH_3$ is set to 60 sccm, and total pressure is set to several m to several Torr.

It should be noted that the conditions are not necessarily limited to the temperatures, the flow amounts and the like, mentioned above, but, as will be described below, when the conditions are appropriately set, the film formation having excellent properties in covering steps, can be achieved.

Figure 2:
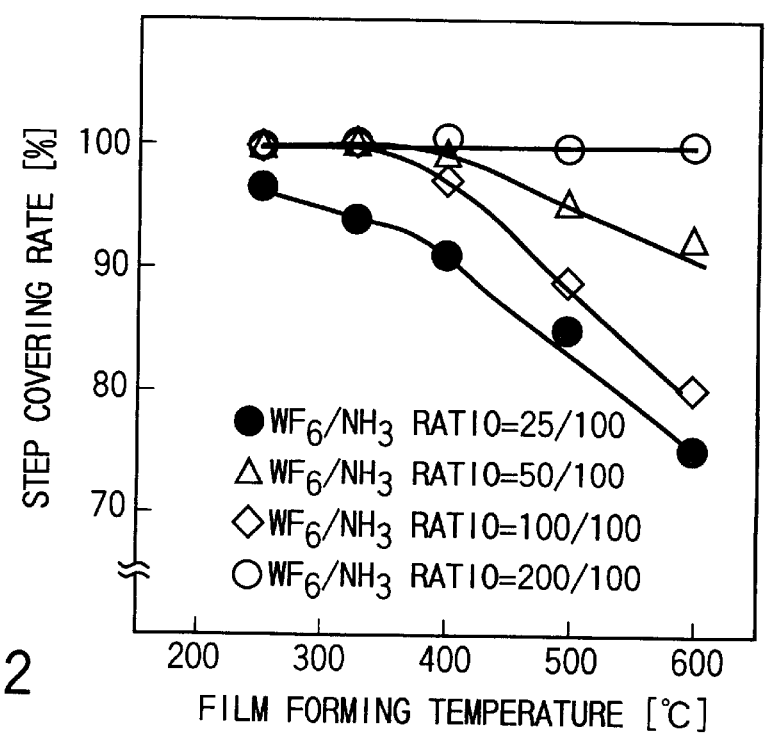
FIG. 2 is a graph illustrating the step covering rate of the WNF film formed by use of the apparatus shown in FIG. 1, with respect to the film forming temperature.

FIG. 2 is a graph illustrating the step covering rate of WNF film with respect to film forming temperature. It should be noted that the step covering rate in the figure is used as a standard to indicate the degree of the step coverage, and the rate is expressed by (A/B)×100 (%) (A: thickness of the WNF film on the bottom of the contact hole, and B: the thickness of the WNF film on the flat section around the contact hole).

FIG. 2 illustrates the manner in which the step covering rate is determined in accordance with the film forming temperature and the flow amount ratio between $WF_6$ and $NH_3$ ($WF_6/NH_3$).

In consideration of these properties, under the conditions that the flow amount Q1 of $WF_6$ is set to 10 to 1000 sccm, the flow amount of Q2 of $NH_3$ is set to 10 to 1000 sccm, and when the film forming temperature is in a range of 250° C. to 400° C., the flow amount ratio between these, that is, Q1/Q2, is set to Q1/Q2≧0.5, preferably Q1/Q2≧1, or when the film forming temperature is in a range of 400° C. to 600° C., Q1/Q2, is set to Q1/Q2≧1, preferably Q1/Q2≧2, it becomes possible to achieve a film formation having excellent step coverage at a hole portion.

When a film is actually formed, a carrier gas such as $H_2$, $N_2$ or Ar may be allowed to flow there at the same time. In the case where $H_2$ is added as a carrier gas, the $H_2$ gas serves to assist the reduction reaction of $WF_6$.

The following are descriptions on the step coverage, the film stress, the concentration of fluorine, the specific resistance and the crystal orientation obtained when a WNF film is formed with use of the above-described CVD apparatus.

For the evaluation of the WNF film, the film forming temperature was set to 400° C., the film forming pressure was set to 0.3 Torr, and a contact hole having an opening diameter of 0.5 μm and a depth of 1.5 μm was used. Further, the step covering rate was obtained by measuring a thickness A (angstrom) of a WNF film when it is formed on the bottom of a contact hole such that a thickness B at a flat portion around the contact hole becomes 1000 angstrom. The step covering rates listed below are values obtained by the above-described evaluation method.

Figure 3:
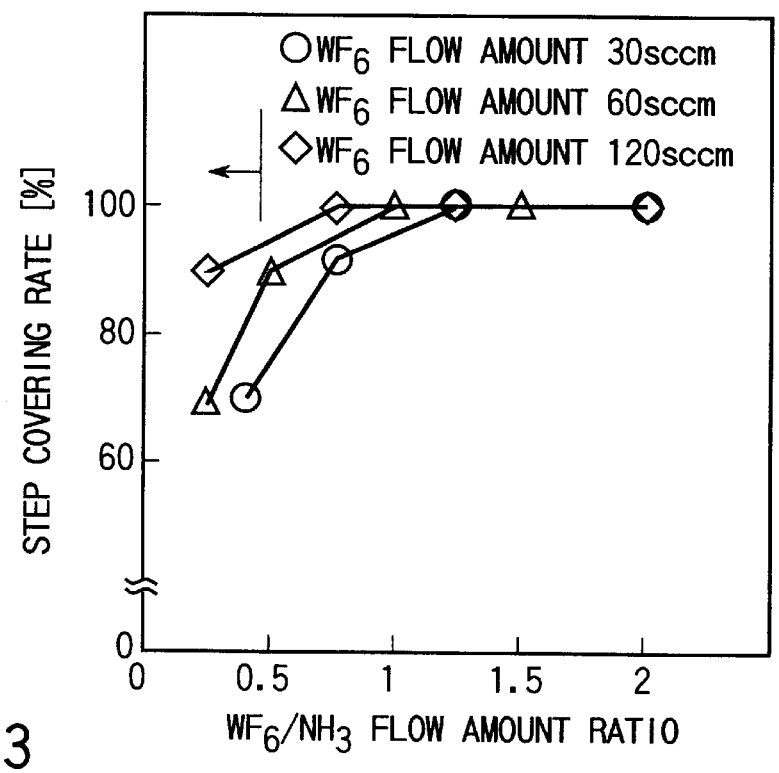
FIG. 3 is a graph illustrating the step covering rate of the WNF film formed by use of the apparatus shown in FIG. 1, with respect to the flow amount ratio of $WF_6/NH_3$.

FIG. 3 is a graph showing the step covering rate of WNF film with respect to the flow amount ratio of $WF_6/NH_3$.

As can be understood from FIG. 3, in the case where the flow amount of $WF_6$ is set to Q1, and the flow amount of $NH_3$ is set to Q2, for $Q1/Q2 \geq 1$, a step covering rate of 100% can be obtained regardless of the flow amount of $WF_6$. Further, for $Q1/Q2 \geq 0.5$, a step covering rate of 90% or higher can be obtained. According to the researches conducted by the inventors of the present invention, it was found that with a WNF film exhibiting a step covering rate of 90% or higher, a highly reliable plug without a wiring error can be obtained if the plug is formed of a blanket W afterwards.

As described above, the step coverage is dependent on the film forming temperature, and a film having an excellent step coverage can be formed in the case where the flow amount ratio Q1/Q2 is set to $Q1/Q2 \geq 0.5$, preferably $Q1/Q2 \geq 1$ when the film forming temperature is within a range of 250° C. to 400° C., and to $Q1/Q2 \geq 1$, preferably $Q1/Q2 \geq 2$ when the film forming temperature is within a range of 400° C. to 600° C.

Figure 4:
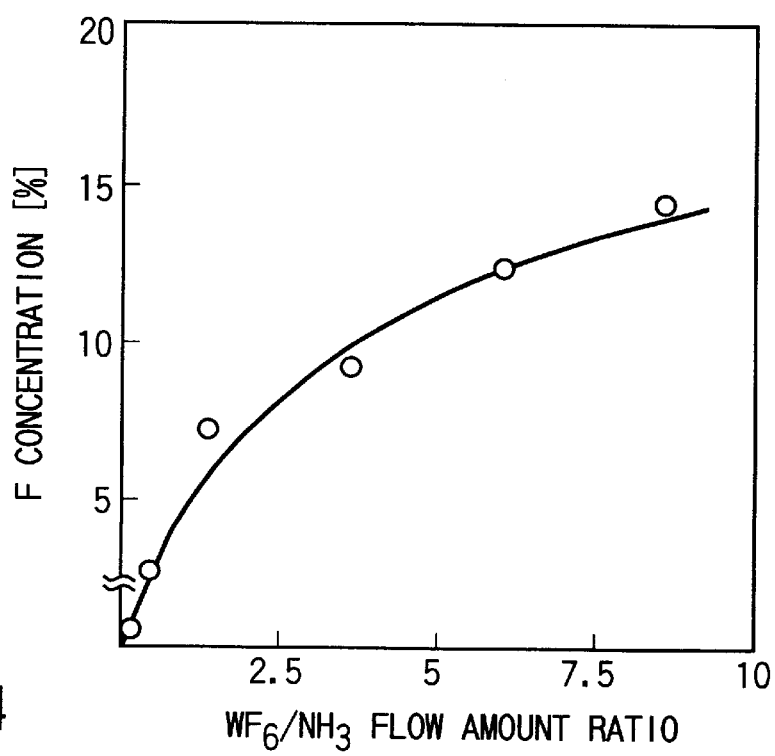
FIG. 4 is a graph illustrating the concentration of fluorine in the WNF film formed by use of the apparatus shown in FIG. 1, with respect to the flow amount ratio of $WF_6/NH_3$.

FIG. 4 is a graph showing the concentration of fluorine with respect to the flow amount ratio of $WF_6/NH_3$. This figure illustrates that the concentration of fluorine is dependent on the flow amount ratio of $WF_6/NH_3$, and therefore when the flow amount ratio of $WF_6/NH_3$ is increased, the concentration of fluorine is increased.

Figure 5:
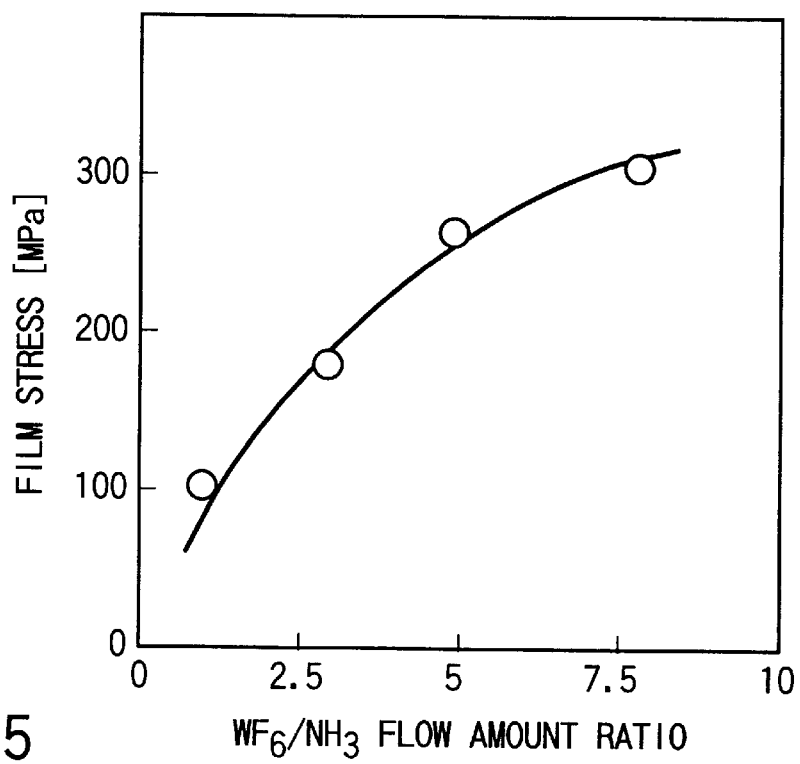
FIG. 5 is a graph illustrating the film stress of the WNF film formed by use of the apparatus shown in FIG. 1, with respect to the flow amount ratio of $WF_6/NH_3$.

FIG. 5 is a graph showing the film stress with respect to the flow amount ratio of $WF_6/NH_3$. This figure illustrates that the film stress is dependent on the flow amount ratio of $WF_6/NH_3$, and therefore when the flow amount ratio of $WF_6/NH_3$ is excessively increased, the film stress is increased.

Figure 6:
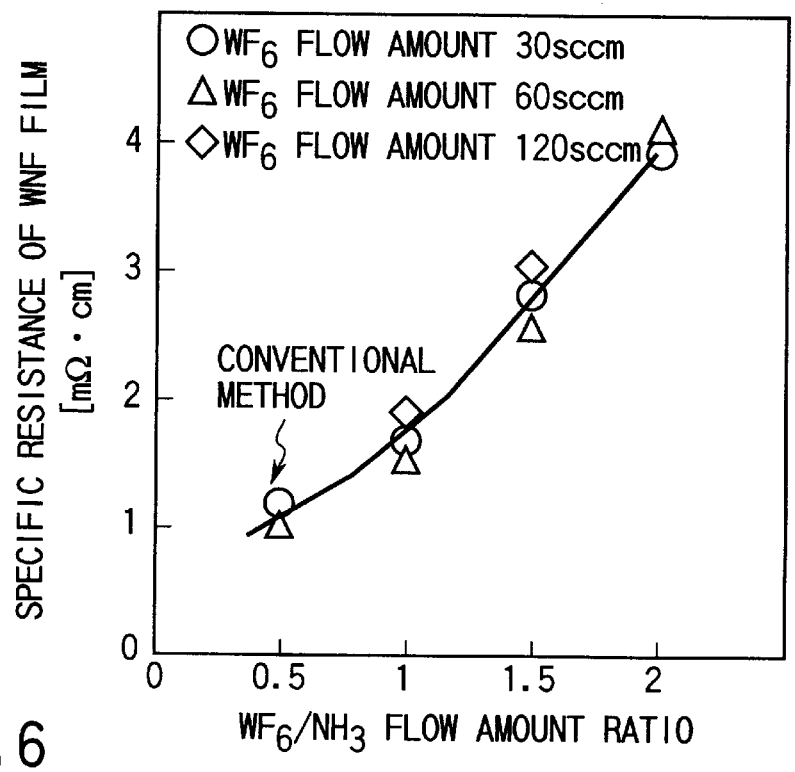
FIG. 6 is a graph illustrating the specific resistance of the WNF film formed by use of the apparatus shown in FIG. 1, with respect to the flow amount ratio of $WF_6/NH_3$.

FIG. 6 is a graph showing the specific resistance of the WNF film with respect to the flow amount ratio of $WF_6/NH_3$. This figure illustrates that the specific resistance of the WNF film is dependent not on the flow amounts of $WF_6$ and $NH_3$ themselves, but only on the flow amount ratio of $WF_6/NH_3$. For a flow amount ratio Q1/Q2=1, the specific resistance is 1.5 to 1.8 mΩ.cm, and for a flow amount ratio Q1/Q2=2, the specific resistance is about 4 mΩ.cm. Thus, the specific resistance increases as the flow amount ratio increases. It should be noted that as the flow amount ratio Q1/Q2 increases, the film stress tends to decrease.

Figure 7A:
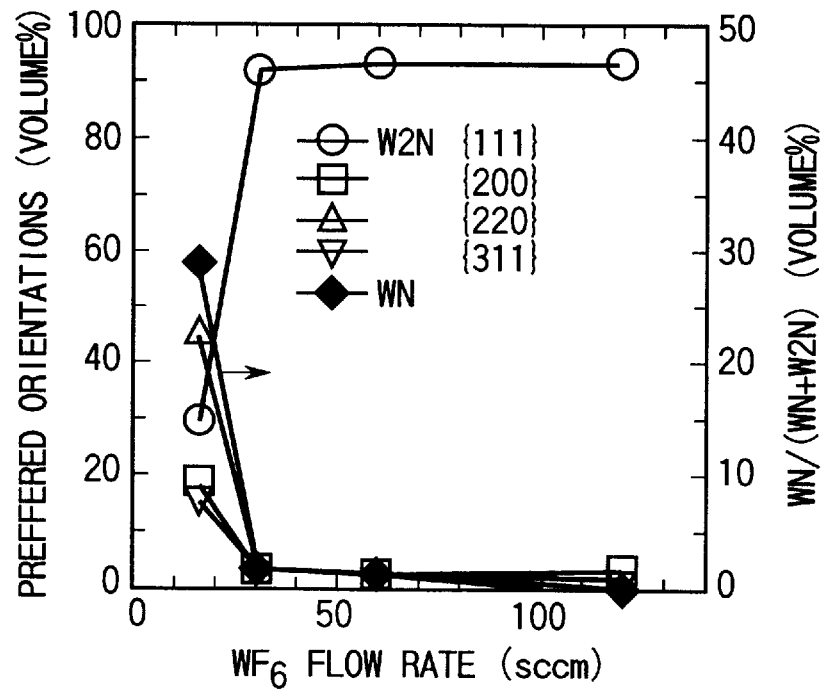
FIGS. 7A and 7B are graphs illustrating the crystal orientation and formed crystal phase of the WNF film formed by use of the apparatus shown in FIG. 1, with respect to the flow amount $WF_6$ and that of $NH_3$.
Figure 7B:
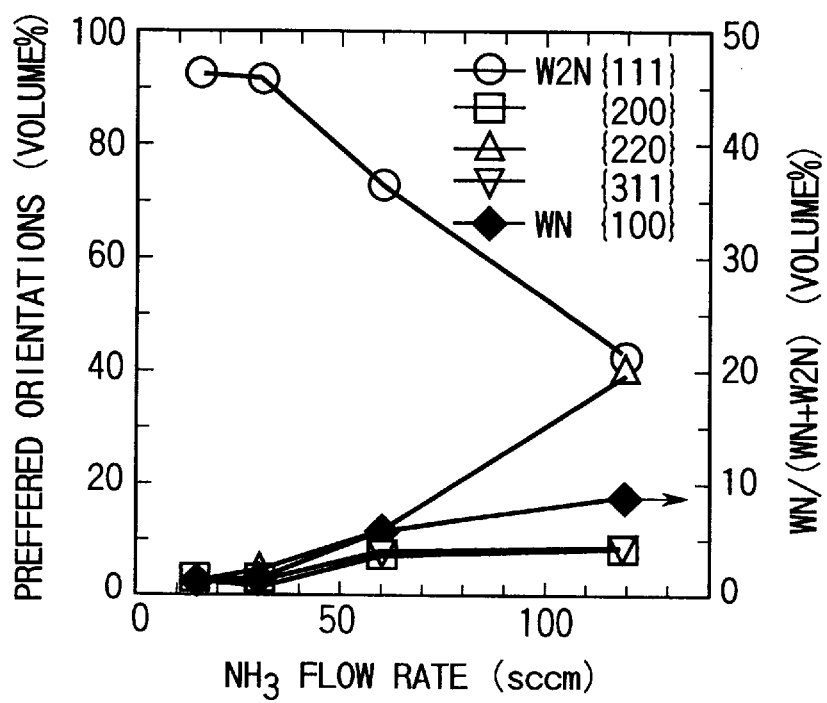

FIGS. 7A and 7B are graphs illustrating the crystal orientation and the crystal phase created, with respect to the flow amounts of $WF_6$ and $NH_3$, regarding the WNF film formed with use of the apparatus shown in FIG. 1.

As can be seen from FIG. 7A, when $W_2Nb$ has an orientation of {111}, the orientation is raised as the flow amount of $WF_6$ is increased, whereas when $W_2N$ has an orientation of {200}, {220} or {311}, the orientation is lowered as the flow amount of $WF_6$ is increased. Further, as can be seen from FIG. 7B, when $W_2Nb$ has an orientation of {111}, the orientation is raised as the flow amount of NH3 is decreased, whereas when $W_2N$ has an orientation of {200}, {220} or {311}, the orientation is lowered as the flow amount of NH3 is decreased.

The evaluation of the crystal structure of the WNF film formed by the above-described vacuum CVD method was made by X-ray diffraction, and it was found that the crystal has a priority orientation to (100) of $W_2N$. The evaluation further revealed that as the flow amount increases, a higher orientation to (100) of $W_2N$ is exhibited.

Next, a second example of the structure of the film forming apparatus used in the present invention and the film formation properties obtained by the apparatus, and the like will now be described.

Figure 8:
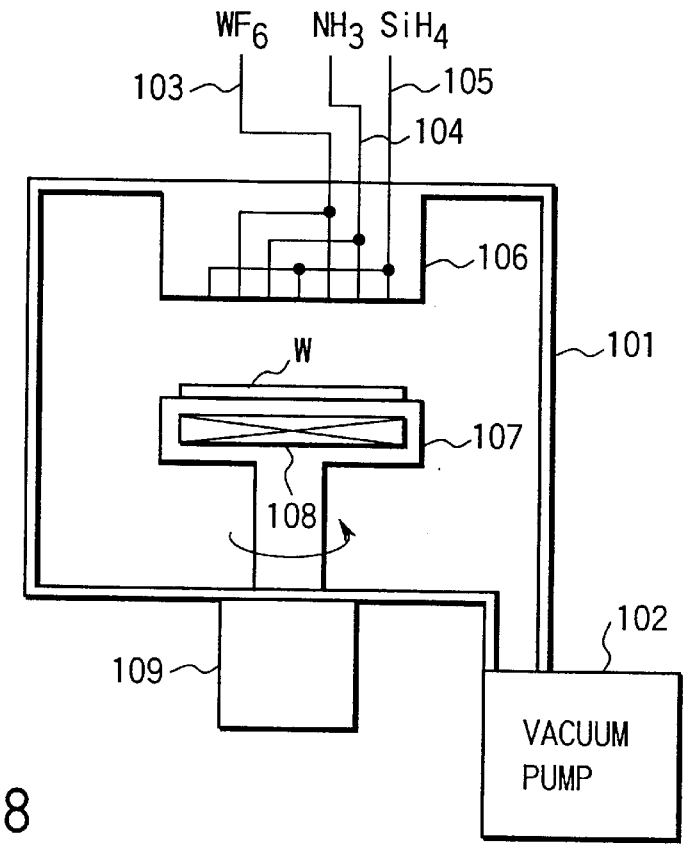
FIG. 8 is a block diagram illustrating the second example of the structure of the film forming apparatus according to the present invention.

FIG. 8 is a schematic block diagram briefly showing a leaf-type reduced-pressure (vacuum) thermal CVD apparatus according to the second example of the structure of the apparatus.

The difference from the film forming apparatus of the first example shown in FIG. 1 resides in that the wafer is rotated at high speed.

As can be seen in the figure, to a chamber 101, a vacuum pump 102 and raw material gas supply pipes 103, 104 and 105 are connected. $WF_6$, $NH_3$ and $SiH_4$ are supplied (if necessary) to the material gas supply pipes 103, 104 and 105, respectively. Further, Ar can be introduced as a carrier gas. These material gases are supplied to the chamber 101 via a dispersion disk 106 for dispersing gas to supply it onto a wafer W. A susceptor 107 is provided within the chamber, and a resistance heating-type heater 108 is built in the susceptor 107. A wafer W is held on the susceptor 107, and it is heated with the resistance heating-type heater 108. Further, the susceptor 107 and the heater 108 can be rotated as an integral unit by means of a rotation drive system 109 provided underneath the susceptor 107, and the rotation rate thereof is in a range of 0 to 5000 rpm.

The material gases, namely, $WF_6$, $NH_3$ and $SiH_4$, and the carrier gas, Ar, are introduced to the chamber 101 as the flow amount of each of them is controlled by a respective mass flow controller, which is not shown. Further, the chamber 101 and the vacuum pump 102, themselves, have a structure capable of being heated such that a reaction product generated while the formation of film, cannot adhere to the internal structure thereof, and they can be heated within a temperature range of 100° C. to 200° C.

In the case of forming a WNF film, a wafer W is held on the susceptor 107, and the material gases, $WF_6$ and $NH_3$ are introduced to the chamber 101 while keeping the temperature of the substrate at 600° C. or less, preferably, in a range of 250° C. to 500° C., by the resistance heating type heater 108, and allowing Ar serving as a carrier gas, to flow at 10 slm or more, preferably 20 slm or more. Then, a film is formed under conditions that, for example, the flow amount of $WF_6$ is set to 60 sccm, and the flow amount of $NH_3$ is set to 60 sccm, and total pressure is set to several m to several Torr. The rotation speed of the substrate during the formation of a film is set to 500 rpm or higher.

Under the conditions that the flow amount Q1 of $WF_6$ is set to 10 to 1000 sccm, the flow amount Q2 of $NH_3$ is set to 10 to 1000 sccm, and when the film forming temperature is in a range of 250° C., to 400° C., the flow amount ratio between these, that is, Q1/Q2, is set to $Q1/Q2 \geq \frac{1}{4}$, preferably $Q1/Q2 \geq \frac{1}{2}$, or when the film forming temperature is in a range of 400° C. to 600° C., the flow amount ratio Q1/Q2 is set to $Q1/Q2 \geq \frac{1}{2}$, preferably $Q1/Q2 \geq 1$, it becomes possible to achieve a film formation having excellent step coverage at a hole portion.

When a film is actually formed, a carrier gas such as $H_2$ gas or $N_2$ gas may be allowed to flow there in place of Ar gas. In the case where $H_2$ is added as a carrier gas, the $H_2$ gas serves to assist the reduction reaction of $WF_6$.

The following are descriptions on the step coverage, the film stress, the concentration of fluorine, the specific resistance and the orientation obtained when a WNF film is formed with use of the above-described high-speed rotation type CVD apparatus. For the evaluation of the WNF film, the film forming temperature was set to 400° C., and the film forming pressure was set to 0.3 Torr.

Figure 9:
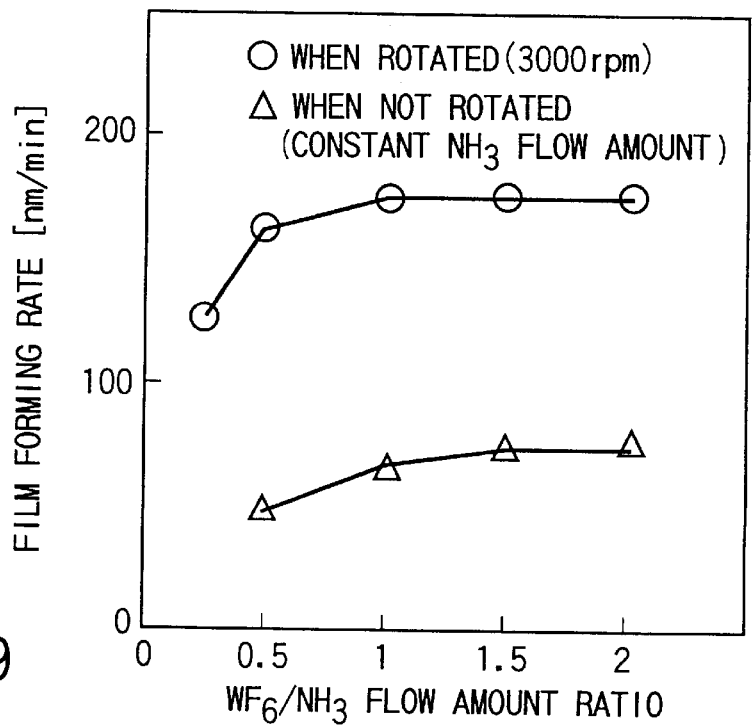
FIG. 9 is a graph illustrating the film forming rate of the WNF film formed by use of the apparatus shown in FIG. 8, with respect to the flow amount ratio of $WF_6/NH_3$.

FIG. 9 is a graph showing the rate of the formation of a WNF film with respect to the flow amount ratio of $WF_6/NH_3$, in the case where the rotation speed of the substrate is varied.

In this case, the flow amount ratio of $WF_6/NH_3$, is varied by changing the flow amount of WF6 while keeping the flow amount of $NH_3$ at constant. As can be understood from FIG. 9, when the rotation speed of the substrate is 3000 rpm, the film formation rate is enhanced twice as high or more at any flow amount ratio, as compared to the case where the substrate is not rotated. This is because the thickness of the interface layer formed directly on the substrate is reduced by rotating the substrate at high speed, and therefore the amount of supply of the gas is increased.

Figure 10:
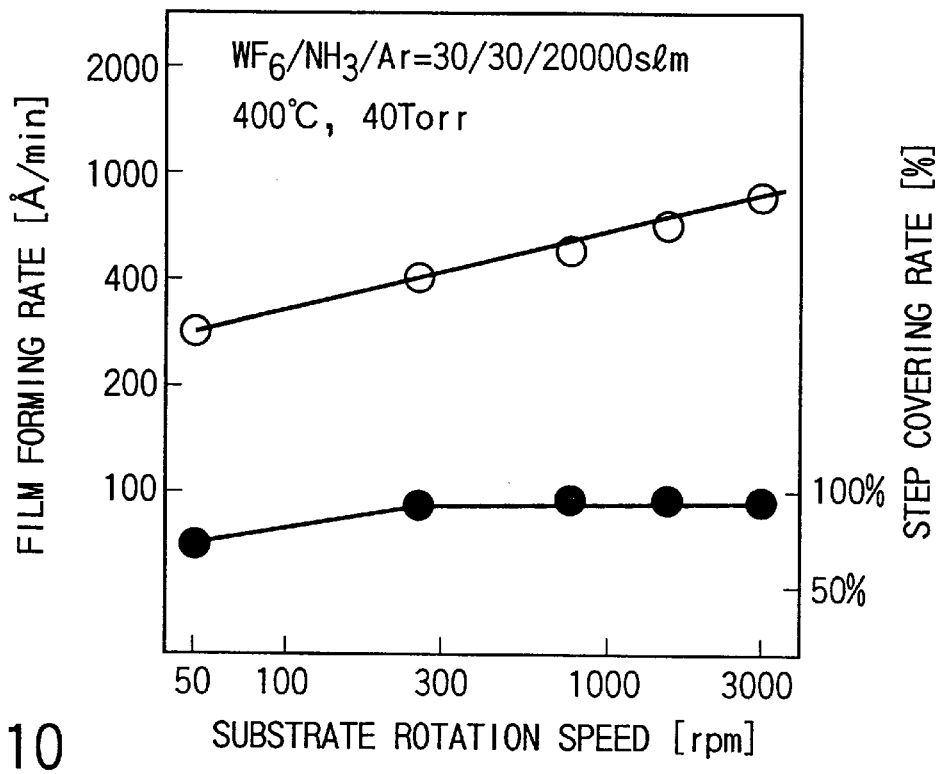
FIG. 10 is a graph illustrating the film forming rate and step covering rate of the WNF film formed by use of the apparatus shown in FIG. 1, with respect to the rotation speed of the substrate.

FIG. 10 is a graph illustrating the film forming rate and the step coverage with respect to the substrate rotating speed.

As is clear from this figure, the effect of enhancing the film forming rate can be obtained when the substrate rotating speed is 500 rpm or higher. The pressure of the gas should be in a range from 10 to 100 Torr as a total pressure, to obtain the effect of the present invention; however in a range from 1 Torr to atmospheric pressure, some effect can be expected.

Figure 11:
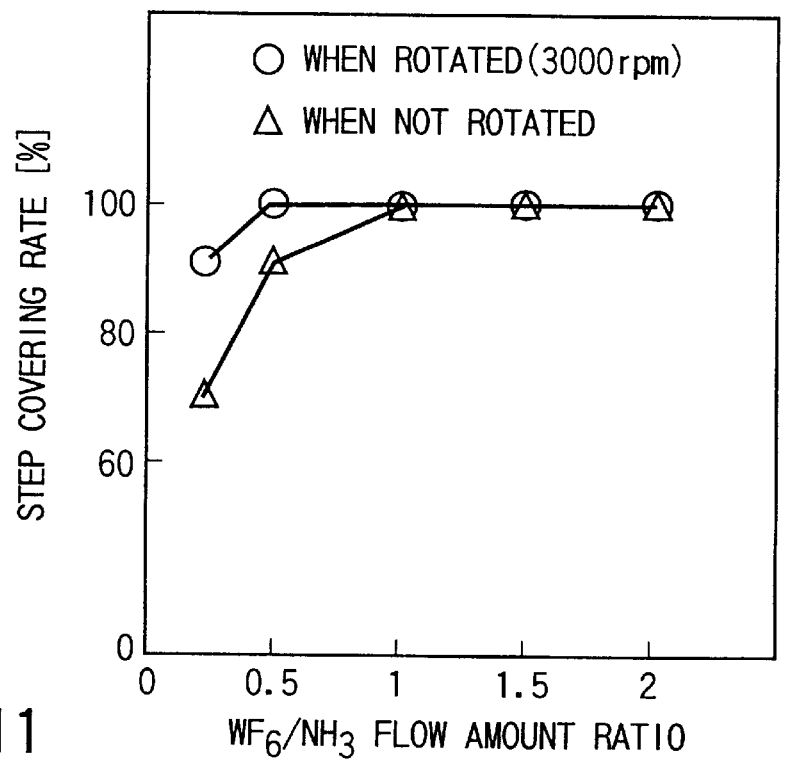
FIG. 11 is a graph illustrating the step covering rate of the WNF film formed by use of the apparatus shown in FIG. 8, with respect to the flow amount ratio of $WF_6/NH_3$.

FIG. 11 is a graph illustrating the step covering rate of WNF film with respect to the flow amount ratio of $WF_6/NH_3$.

In the case where the flow amount of $WF_6$ is set to Q1, and the flow amount of $NH_3$ is set to Q2, if the substrate is not rotated, a step covering rate of 100% can be obtained only for Q1/Q2≧1, whereas if the substrate is rotated, a step covering rate of 100% can be obtained for Q1/Q2≧0.5. This is because if the film is formed without rotating the substrate, the removal of byproducts of the reaction between $WF_6$ and NH3, created within the contact hole and the like, does not proceeds, and therefore the reaction is restrained. As the substrate is rotated at high speed, the byproducts of the reaction between $WF_6$ and $NH_3$, can be removed, and therefore the film having an excellent step coverage can be formed even if the flow amount ratio between $WF_6$ and $NH_3$, is low.

Figure 12:
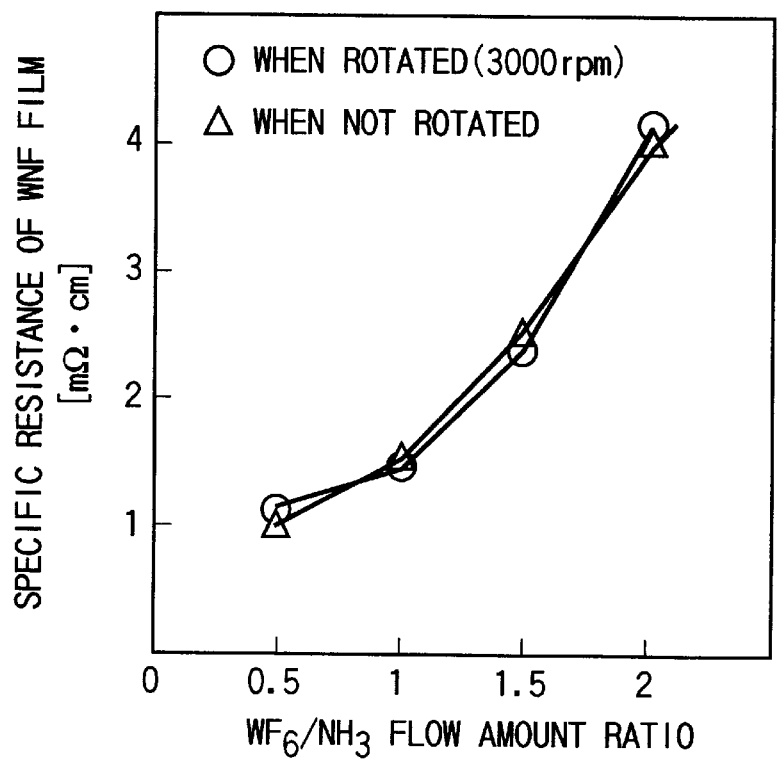
FIG. 12 is a graph illustrating the specific resistance of the WNF film formed by use of the apparatus shown in FIG. 8, with respect to the flow amount ratio of $WF_6/NH_3$.

FIG. 12 is a graph showing the specific resistance of the WNF film with respect to the flow amount ratio of $WF_6/NH_3$.

As can be seen from FIG. 12, the specific resistance of the WNF film is dependent not on whether or not the substrate is rotated, or on the flow amounts of $WF_6$ and $NH_3$ themselves, but only on the flow amount ratio Q1/Q2. For a flow amount ratio Q1/Q2=1, the specific resistance is 1.5 to 1.8 mΩ.cm, and for a flow amount ratio Q1/Q2=2, the specific resistance is about 4 mΩ.cm. Thus, the specific resistance increases as the flow amount ratio increases.

The crystallizing property of the WNF film depends greatly on the film formation temperature, and when the temperature is 400° C., the film exhibits an amorphous state or an amorphous state where it is dotted with fine crystals having sizes of about 20 to 50 angstrom. When the film forming temperature is further increased to 420° C. or higher, the film will make a transition to a polycrystalline state. The amorphous film or the other amorphous film dotted with fine crystals each make a transition when they are subjected to a heat treatment at 400° C. to 700° C. after the formation of the films, such that the amorphous regions of the film are changed to fine crystals, and finally the film becomes a fine crystalline type. Such an amorphous film or a fine crystalline film has a sufficient property as a barrier for the diffusion of Cu. Further, since the WNF film contains fluorine and tungsten within itself, such a film has an advantage of less corrosion caused by $WF_6$, which may occur when the W-CVD technique using $WF_6$ is employed.

Next, an example where the present invention is applied to a semiconductor device such as an integrated circuit device will now be described.

Figure 13A:
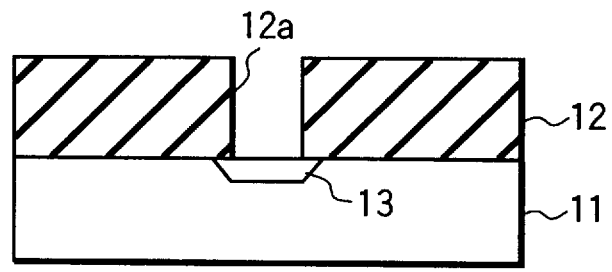
FIGS. 13A to 13C are cross sectional views showing the first example of the structure of the semiconductor device according to the present invention.
Figure 13B:
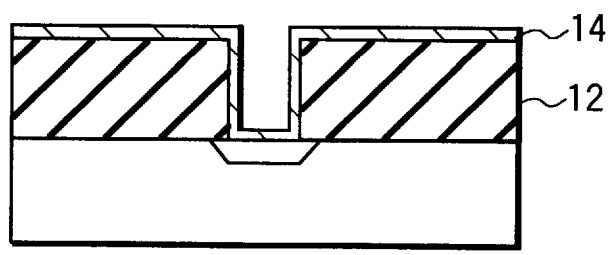
Figure 13C:
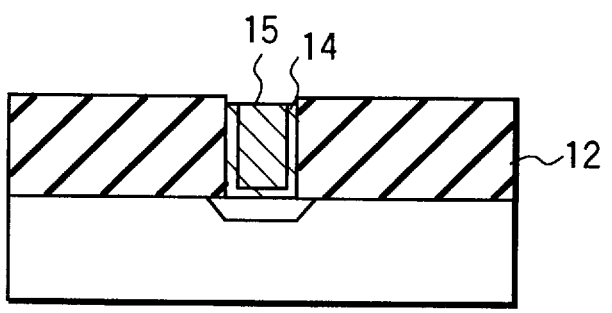

FIGS. 13A to 13C are diagrams showing the first example of the structure of a semiconductor device, and they illustrate a method of forming a tungsten contact, in which a WNF film is used as a metal contact layer. It should be noted that either one of the CDV apparatus shown in FIGS. 1 and 8 can be used to form a WNF film; however in this example, the apparatus shown in FIG. 1 is used.

First, as can be seen in FIG. 13A, an $SiO_2$ film 12 having a thickness of 800 nm is deposited on an n-type (100) silicon substrate, and a fine contact hole 12a having a diameter of 0.1 to 1.0 μm is formed by lithographic and dry etching techniques. Then, an ion implantation and heat treatment are carried out to form a p-type diffusion layer 13.

Next, as shown in FIG. 13B, a WNF film 14 is deposited to have a thickness of 10 to 20 nm by a vacuum CVD method. The conditions for the formation of the film are set as follows: $WF_6$=30 sccm, $NH_3$=30 sccm, the temperature of the substrate is 500° C., and the film forming pressure is 0.1 to 1 Torr.

Then, as shown in FIG. 13C, a W film is deposited such that the contact hole 12a is filled, by the CVD method using $WF_6$ and hydrogen. After that, a CMP (chemical mechanical polishing) is carried out to leave W only in the contact hole, thus forming a contact plug 15.

It should be noted that the WNF film 14 does not entails the drawback of the film being peeled off, and therefore it can be polished at the same rate as that for the W film 15.

The contact resistance between the WNF film 14 and the diffusion layer 13 is low, and more specifically, the contact resistance exhibits a value of 70Ω or less for a contact hole having a diameter of 0.3 μm, for example. Further, an increase in junction leak to the silicon substrate 11 cannot be found, and the specific resistance of the WNF film 14 is in a range of about 700 to 2000 μmΩ.

Regarding the film forming pressure, even it is as high as 100 Torr, the result of the film formation is excellent.

Further, regarding the film forming temperature, when it is in a range of 250° C. to 700° C., a stable film formation can be achieved. However, when the film forming temperature becomes 600° C. or higher, the step coverage is deteriorated, and therefore such a temperature is not suitable for the filling up of the fine contact hole. On the other hand, when 400° C. or lower, the F concentration in the film is increased, and the specific resistance becomes 2000 μmΩ.cm or more. Therefore, it is preferable that the film should be formed at a temperature ranging from 400° C. to 600° C.

Regarding the flow amount ratio between $WF_6$ and $NH_3$, an excellent film formation can be achieved when it is in a range of 0.05 to 10. A film with a particularly excellent step coverage can be formed when the flow amount ration is 2 or less.

Further, the fluorine concentration in the WNF film can be controlled by varying the conditions for the film formation; however if the conditions for the film formation are changed, not only the fluorine concentration, but also the step coverage is greatly changed. When the fluorine concentration is 0.1 to 20% at atomic density, a fairly good film formation can be achieved, when it is 1 to 20%, a film formation with an excellent step coverage can be achieved, and when it is 1 to 5%, a film formation with an even more excellent step coverage can be achieved.

In the case where hydrogen is added to the material gas, the gas phase reaction is suppressed, and a decrease in the amount of particles occurs. It is only natural that, apart from the material gas, argon gas or nitrogen gas can be added as carrier gases.

The effect of the WNF film as a metal contact layer is good when Al or Cu is used in place of W. Further, even in the case where an Al film which serves as a wire is formed on the WNF film by a sputtering method, and then the resultant is subjected to annealing at a high temperature of 600° C. to make the Al layer to reflow, no reaction occurs in the interface between the WNF film and the Al film, thus obtaining an excellent contact property.

FIGS. 14A to 14D are diagrams showing the second example of the structure of the semiconductor device, and illustrate the steps of the manufacture of the device when the WNF film is used in the cell portion of DRAM. It should be noted that either one of the CDV apparatus shown in FIGS. 1 and 8 can be used to form a WNF film; however in this example, the apparatus shown in FIG. 1 is used.

Figure 14A:
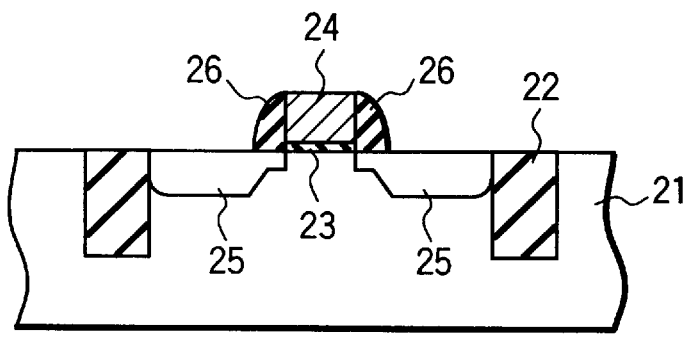
FIGS. 14A to 14D are cross sectional views showing the second example of the structure of the semiconductor device according to the present invention.

First, as can be seen in FIG. 14A, a buried element separation layer is deposited on an p-type (100) silicon substrate 21, and then a gate oxide film 23 is formed thereon to have a thickness of 5 nm. After that, an arsenic-doped silicon film is deposited on the resultant, and the deposited film is patterned to form a gate electrode 24. Subsequently, using the gate electrode 24 as a mask, a source-drain diffusion layer 25 is formed by an As ion implantation, and a heat treatment, which follows. Further, an SiN film is deposited by a CVD method, and another dry etching is carried out on the entire surface so as to form a side wall 26. After that, using the gate electrode 24 and the side wall 26 as masks, an ion implantation is carried out to form a so-called LDD (lightly doped drain).

Figure 14B:
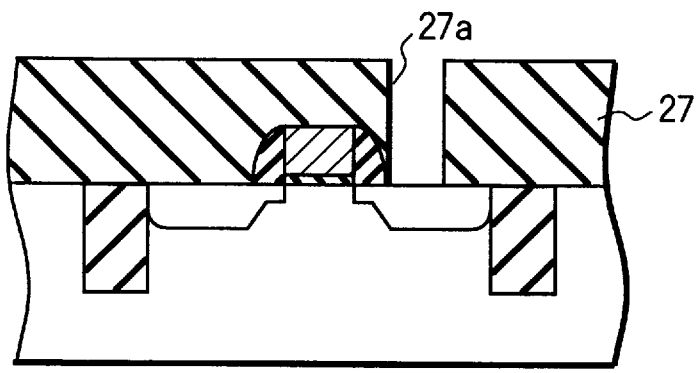

Next, as can be seen in FIG. 14B, a BPSG film 27 is deposited by the CVD method, and a heat treatment is carried out at 900° C. Then, a contact hole 27a is formed by lithographic and dry etching techniques.

Figure 14C:
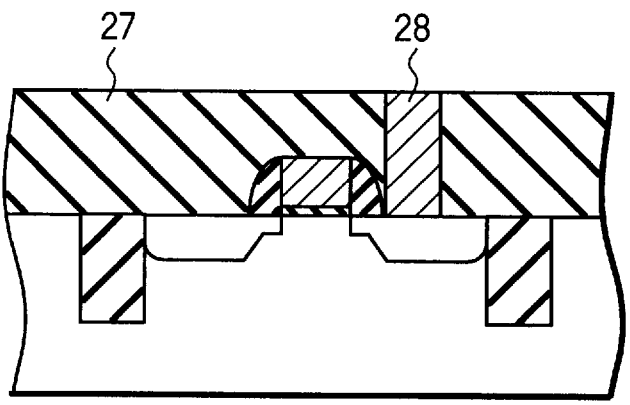

Next, as shown in FIG. 14C, the natural oxide film situated on the bottom of the contact hole 27a is etched with HF, and a WNF film 28 is deposited in the contact hole 27a by a vacuum CVD method. The conditions for the formation of the film are set as follows: $WF_6$=30 sccm, $NH_3$=30 sccm, $SiH_4$=30 sccm, the film forming temperature is 400° C., and the film forming pressure is 0.1 to 1 Torr. After that, a CMP is carried out to leave the WNF film 28 only in the contact hole 27a, thus forming a contact plug.

Figure 14D:
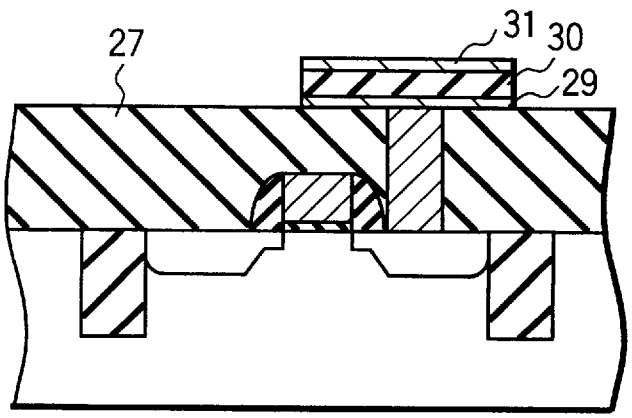

Next, as can be seen in FIG. 14D, an Rn film 29 is deposited on the sputtering method, and a BSTO film 30 made of a high dielectric film is deposited by the sputtering method. Further, an WNF film 31 is formed by the vacuum CVD method, and then, with use of RIE technique, the Ru film 29, the BSTO film 30 and the WNF film 31 are etched, thus forming a capacitor portion.

The contact plug of the WNF film 28, does not include a seam or void inside, and therefore it can be buried at an excellent condition.

Regarding the film forming pressure, even it is as high as 40 Torr, the result of the film formation is excellent. Further, regarding the film forming temperature, when it is in a range of 200° C. to 600° C., a stable film formation can be achieved.

Regarding the flow amount of each of the gases used, for $WF_6$=10 sccm, an excellent WNF film containing Si can be formed when $NH_3$=5 to 100 sccm and $SiH_4$=30 to 100 sccm.

It is only natural that Ar or $N_2$ may be added to each of the material gases. In the case where hydrogen is added to the material gas, the gas phase reaction is suppressed, and a decrease in the amount of particles occurs.

Figure 15:
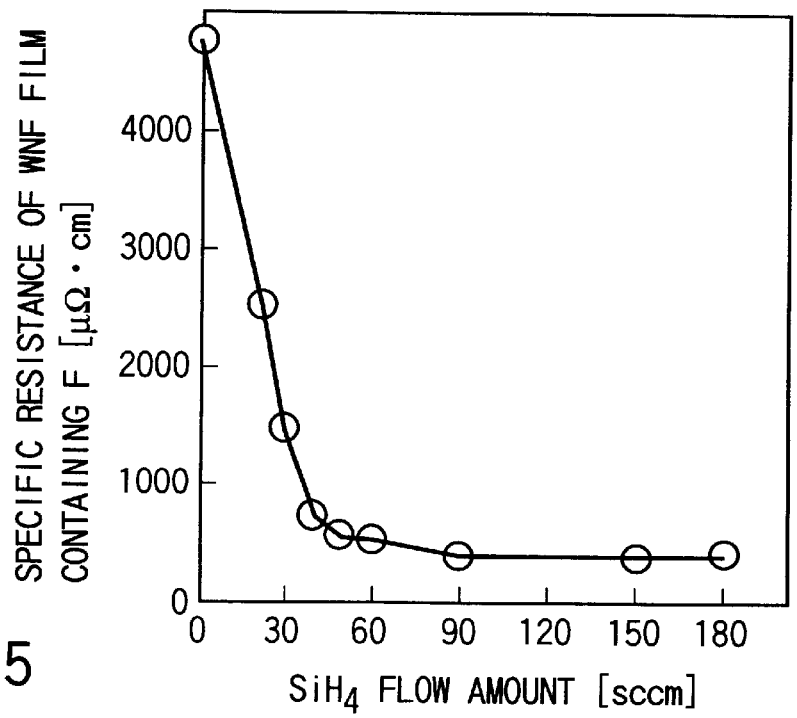
FIG. 15 is a graph illustrating the specific resistance of the WNF film with respect to the flow amount of $SiF_4$.

FIG. 15 is a graph showing the specific resistance of the WNF film with respect to the flow amount ratio of silane under the conditions, $WF_6$=30 sccm, $NH_3$=30 sccm, the film forming temperature is 400° C.

As can be seen in FIG. 15, the specific resistance of the WNF film decreases, as the flow amount of $SiH_4$ decreases, and when the flow amount of $SiH_4$ is 60 sccm or more, Si is taken into the film by an amount of about 1%, and a decrease in the specific resistance cannot be detected. It should be noted that the effect of lowering the resistance of the WNF film by adding silane, can be obtained under other film formation conditions.

Further, substantially the same effect can be obtained when, in place of silane, disilane, dichlorosilane, monochlorosilane, trichlorosilane, monofluorosilane or trifluorosilane is used.

The adhesion of the WNF film with respect to the under-layer is good in the case where the under layer is a heat oxide film, a BPSG film or a silicon nitride film. Further, when the film forming temperature for the WNF film is 300° C. or higher, the obtained film becomes a good diffusion barrier to Cu.

FIGS. 16A to 16D are diagrams showing the third example of the structure of the semiconductor device, and illustrate the steps of the manufacture of the device in connection with the case where the WNF film is used as a metal contact layer to form a W plug. It should be noted that either one of the CDV apparatus shown in FIGS. 1 and 8 can be used to form a WNF film; however in this example, the apparatus shown in FIG. 1 is used.

Figure 16A:
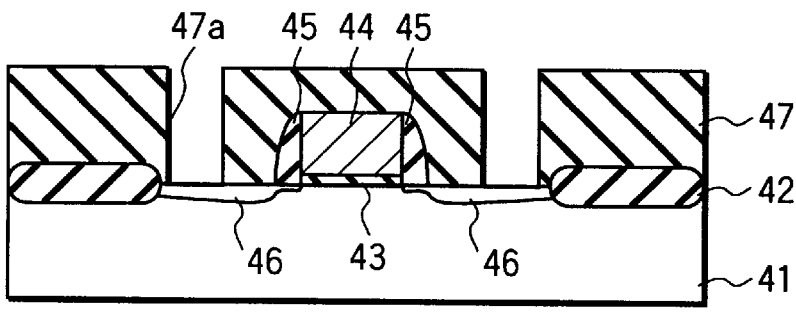
FIGS. 16A to 16D are cross sectional views showing the third example of the structure of the semiconductor device according to the present invention.

First, as can be seen in FIG. 16A, an element separation layer 42 having a thickness of 500 nm and a gate oxide film 43 having a thickness of 5 nm are formed on an p-type (100) silicon substrate 41. Then, a gate electrode 44 made of an arsenic-doped silicon film having a thickness of 500 nm is formed on the gate oxide film 43 by the CVD method, and a side wall 45 made of SiN is formed on a lateral wall of the gate electrode 44. A source-drain diffusion layer 46 is formed by the ion implantation and the heat treatment, which follows, on the portions of the Si substrate 41, which are situated on both side of the gate electrode 44. The source-drain diffusion layer 46 is made by carrying out the ion implantation two times using, for example, the gate electrode 44 and the side wall 45, as a mask in the respective cases, and the layer is made to have a so-called LDD structure.

After forming the above-described structure, a BPSG film 47 is deposited by the CVD method, and a heat treatment is carried out at 900° C. Then, a contact hole 47a is formed by lithographic and dry etching techniques, thus obtaining a structure as shown in FIG. 16A.

Figure 16B:
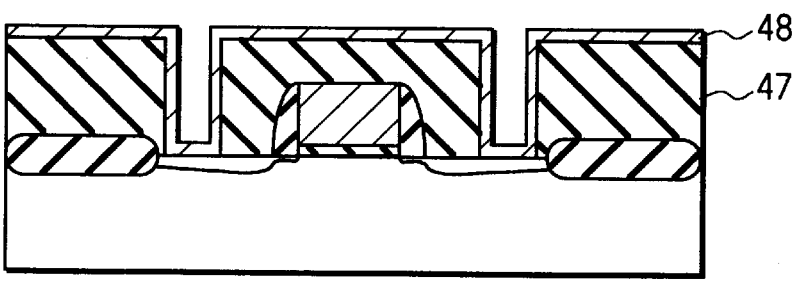

The above-described Si substrate 41 on which a MOSFET is formed, is held on the susceptor in the vacuum CVD apparatus, and the Si substrate is heated by the resistance heater such that the temperature thereof becomes 600° C. or less, preferably, 250° C. to 500° C. Then, the material gases, that is, $WF_6$ and $NH_3$ are introduced to the chamber, thus forming a WNF film 48 having a thickness of 20 nm, as shown in FIG. 16B. The film is formed under conditions that the flow amount of $WF_6$ is set to 60 sccm, and the flow amount of $NH_3$ is set to 60 sccm, and total pressure is set to several m to several Torr. It should be noted that a carrier gas such as $H_2$, $N_2$ or Ar may be made to flow. In the case where $H_2$ is used as a carrier gas, the $H_2$ gas serves to assist the reduction of $WF_6$.

Figure 16C:
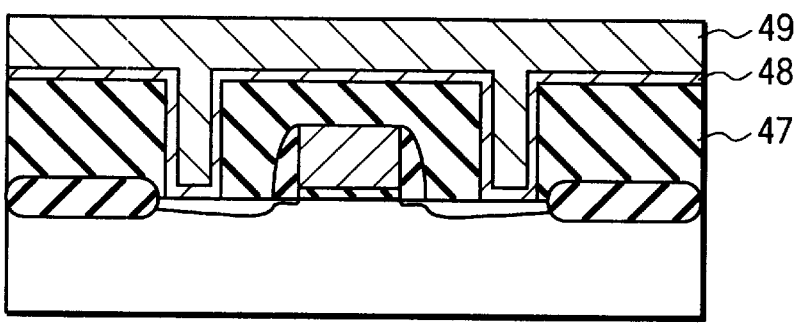

Next, as can be seen in FIG. 16C, a blanket W film 49 made by using the $H_2$ reduction of $WF_6$, is formed.

Figure 16D:
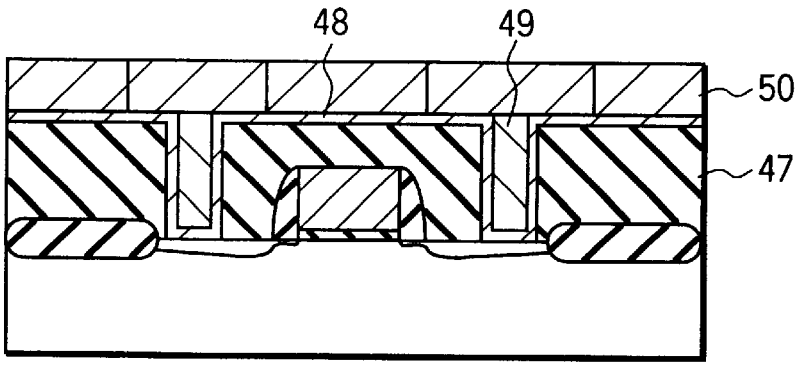

After that, the W film 49 is polished to leave it only within the contact hole by the CMP method, thus forming a contact plug. Subsequently, an Al film 50 serving as a wire, is formed on the Si substrate 41, thus obtaining a structure such as shown in FIG. 16D.

FIGS. 17A to 17D are diagrams showing the fourth example of the structure of the semiconductor device, and illustrate the steps of the manufacture of the device in connection with the case where a dual damascene structure is formed by using the WNF film as a barrier metal. It should be noted that either one of the CDV apparatus shown in FIGS. 1 and 8 can be used to form a WNF film; however in this example, the apparatus shown in FIG. 1 is used.

Figure 17A:
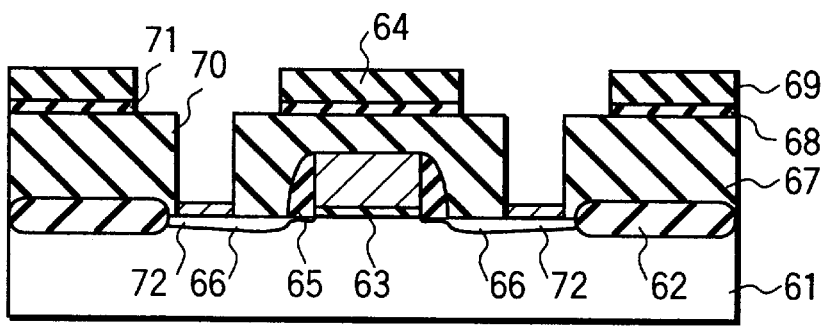
FIGS. 17A to 17D are cross sectional views showing the fourth example of the structure of the semiconductor device according to the present invention.

First, as can be seen in FIG. 17A, an element separation layer 62 having a thickness of 500 nm and a gate oxide film 63 having a thickness of 5 nm are formed on an p-type (100) silicon substrate 61. Then, a gate electrode 64 made of an arsenic-doped silicon film having a thickness of 500 nm is formed on the gate oxide film 63 by the CVD method, and a side wall 65 made of SiN is formed on a lateral wall of the gate electrode 64. A source-drain diffusion layer 66 is formed by the ion implantation and the heat treatment, which follows, on the portions of the Si substrate 61, which are situated on both side of the gate electrode 44. The source-drain diffusion layer 66 is made by carrying out the ion implantation two times using, for example, the gate electrode 64 and the side wall 65, as a mask in the respective steps, and the layer is made to have a so-called LDD structure.

After forming the above-described structure, a BPSG film 67 is deposited by the CVD method, and a heat treatment is carried out at 900° C. Then, an SiN film 68 is formed thereon, and it is patterned by lithographic and dry etching techniques. Subsequently, an SiO$_2$ film 69 is formed by the plasma CVD or the like, and a contact hole 70 and a wire groove 71 are formed at the same by the lithographic and dry etching techniques. Further, a selective CVD using a WF$_6$ gas and a silane gas is carried out to selectively grow a W film 72 on the bottom of the contact hole 70. The W film 72 is designed to serve to reduce the contact resistance. It should be noted that before the W film 72 is selectively formed, a silicide metal such as titanium silicide or cobalt silicide may be formed on the source-drain diffusion layer 66. Thus, a structure as shown in FIG. 17A is obtained.

Figure 17B:
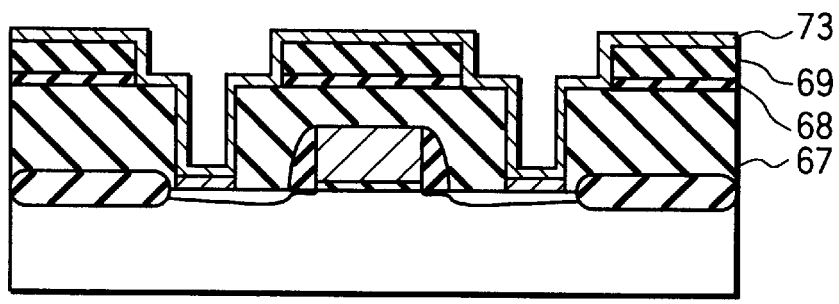

The above-described Si substrate 61 on which a MOSFET is formed, is held on the susceptor in the vacuum CVD apparatus, and then the material gases, that is, WF$_6$ and NH$_3$ are introduced to the chamber. Thus, a WNF film 48 having a thickness of 20 nm is formed by the vacuum CVD method, and a shape such as shown in FIG. 17B is obtained. The film is formed under similar conditions to those of the third example of the semiconductor device described above.

Figure 17C:
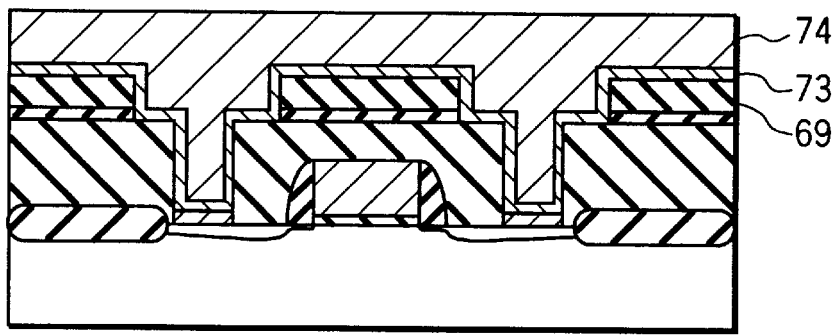

Next, as can be seen in FIG. 17C, a blanket Cu film 74 is formed by the CVD method.

Figure 17D:
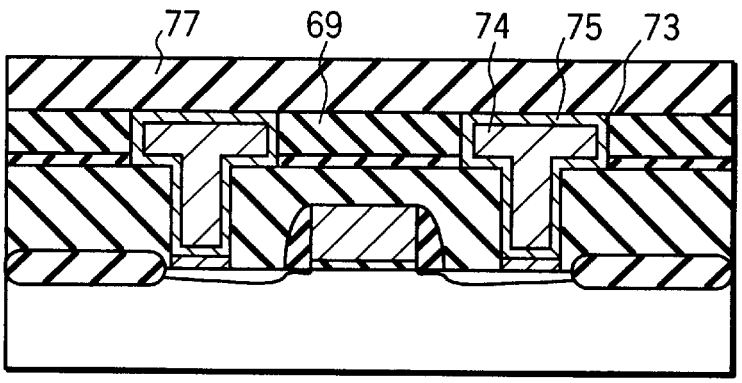

Subsequently, the CMP is carried out to leave the Cu film 74 only within the contact hole 70 and the wire groove 71, and then a WNF film 75 is formed thereon, followed by a patterning operation. After that, an interlayer insulation film 77 is formed by the CVD method, thus obtaining a structure such as shown in FIG. 17D.

After the completion of all the above-described manufacture steps, a wiring having a dual damascene structure is obtained. It should be noted that a wiring material mainly containing Al may be used in place of Cu.

Figure 18:
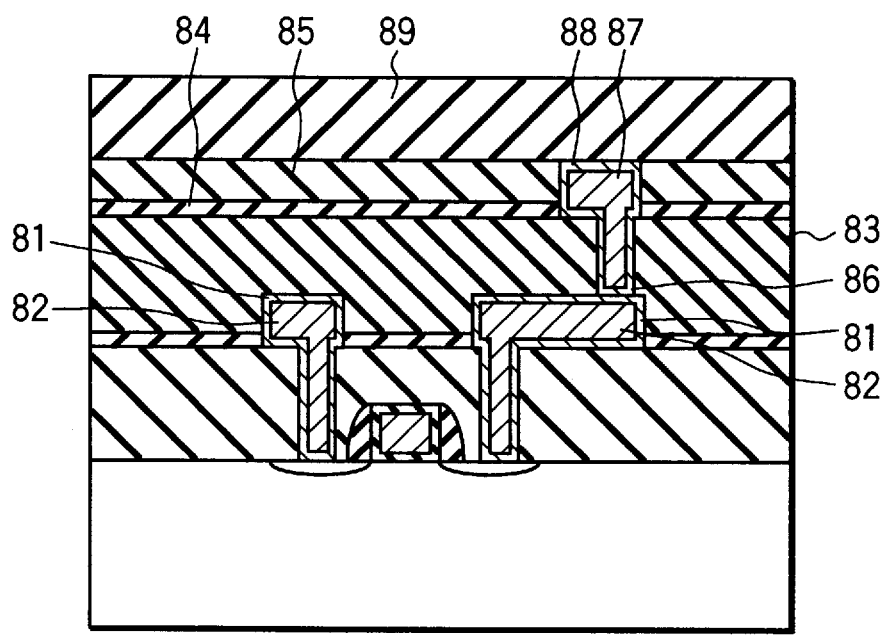
FIG. 18 is a cross sectional view showing the fifth example of the structure of the semiconductor device according to the present invention.

FIG. 18 is a diagram showing the fifth example of the structure of the semiconductor device, and illustrates the case where a multilayer wiring is formed by using the WNF film as a barrier metal. It should be noted that either one of the CDV apparatus shown in FIGS. 1 and 8 can be used to form a WNF film; however in this example, the apparatus shown in FIG. 1 is used.

Up to the step of forming a Cu wiring 82, around which a WNF film 81 is formed, an interlayer insulation film 83 and the like, this example has basically the same steps as those of the fourth example of the semiconductor device illustrated in FIGS. 17A to 17D.

After the interlayer insulation film 83 is formed, an SiN film 85 is formed thereon, followed by patterning, and then an SiO$_2$ film 85 is formed by the plasma CVD or the like. Subsequently, a via hole and a wire groove are formed at the same by the lithographic and RIE processing techniques, in a similar manner to the method described in connection with the fourth example shown in FIGS. 17A to 17D.

Further, the material gases, namely, WF$_6$ and NH$_3$, are introduced to the chamber, and an WNF film 86 having a thickness of 30 nm is formed under similar conditions to those of the third example of the semiconductor device. Then, a Cu film 87 is formed by the CVD method, and subsequently, the CMP is carried out to leave the Cu film 87 only within the contact hole and the wire groove. After that, a WNF film 88 is formed thereon as a Cu diffusion preventing film, followed by a patterning operation. Then, an oxide film 88 is formed, thus obtaining a structure such as shown in FIG. 18.

It should be noted that, in the case where a multilayer wiring is formed by using the WNF film as a barrier metal, a metal film may be filled into the via hole in which the WNF film is formed, to form a contact, and then a wire to be connected to the contact may be formed, without making a dual damascene structure for the via contact and wire of the upper wiring, such as in the fifth example of the semiconductor device.

Further, the above-described examples expect for the second one, do not particularly discuss the introduction of silane during the formation of the WNF film such that Si is contained in the WNF film; however in these examples as well, Si may be contained in the WNF film as in the second example.

Further, in the embodiment, NH$_3$ is used as a nitride gas for the formation of the WNF film; however an alkyl amino acid compound such as (CH$_3$)$_2$NNH$_2$ or (CH$_3$)NNH$_2$ may be used, or N$_2$H$_4$ or a chloride of hydrazine may be used. Furthermore, WF$_6$ is used as the source of W, W(CO)$_6$ or WCl$_6$ may be used.

As described above in detail, in the semiconductor device of the present invention, the atomic density of fluorine contained in tungsten nitride film is set to 1% to 20% (preferably, 1% to 5%), and therefore the step coverage at the hole section can be improved. With this structure, it becomes possible to obtain the excellent effects of the contact layer in the fine hole, the barrier layer, the plug and the like.

Further, with the method of manufacturing a semiconductor device, according to the present invention, the flow amount ratio of gases used for forming a tungsten nitride containing fluorine is set to an appropriate value, and therefore the concentration fluorine contained in the tungsten nitride is increased as compared to the conventional type. Consequently, the step coverage at the hole section can be improved. Furthermore, by rotating the subject to be processed at high speed, a film with a lower resistance and an excellent step coverage can be formed.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. A semiconductor device comprising:
   a first conductive layer:
   an insulating layer in which a hole section which is made through to said first conductive layer; and
   a second conductive layer formed in said hole section, at least a part of said second conductive layer being made of a tungsten nitride film containing fluorine at an atomic density of 1% to 20%.

2. A semiconductor device according to claim 1, wherein the atomic density of fluorine contained said tungsten nitride film is 1% to 5%.

3. A semiconductor device according to claim 1, wherein said tungsten nitride film used for the formation of said second conductive layer is formed such as to cover a surface of said hole section.

4. A semiconductor device according to claim 1, wherein said second conductive layer is made of said tungsten nitride film and a metal film formed on said tungsten nitride film.

5. A semiconductor device according to claim 4, wherein said metal film is made of a tungsten film.

6. A semiconductor device comprising:
   a first conductive layer formed on a main surface of a semiconductor substrate, and constituting a source-drain diffusion layer of a MOS transistor;
   an insulating layer formed on the main surface of said semiconductor substrate, and having a hole section which is made through to said first conductive layer;
   a second conductive layer formed in said hole section, a lower portion of said second conductive layer being connected to said first conductive layer, at least a part of said second conductive layer being made of a tungsten nitride film containing fluorine at an atomic density of 1% to 20%; and
   a third conductive layer connected to an upper portion of said second conductive layer, and constituting an electrode or a wire.

7. A semiconductor device comprising:
   a first conductive layer formed on a main surface of a semiconductor substrate, and constituting a source-drain diffusion layer of a MOS transistor;
   an insulating layer formed on the main surface of said semiconductor substrate, and having a hole section which is made through to said first conductive layer, and a groove section connected to the hole section;
   a second conductive layer formed in said hole section, a lower portion of said second conductive layer being connected to said first conductive layer; and
   a third conductive layer formed in said groove section, and connected to an upper portion of said second conductive layer, such as to constitute a wiring,
   wherein at least a part of said second conductive layer and a part of said third conductive layer being made of a tungsten nitride film containing fluorine at an atomic density of 1% to 20%.

8. A semiconductor device comprising:
   a first insulating film formed on a main surface of a semiconductor substrate having a MOS transistor;
   a first conductive layer formed on an upper side of said first insulating film, and constituting a first wiring;
   a second insulating film formed on the upper side of said first insulating film and said first conductive film, and having a hole section which is made through to said first conductive layer;
   a second conductive layer formed in said hole section, a lower portion of said second conductive layer being connected to said first conductive layer, at least a part of said second conductive layer being made of a tungsten nitride film containing fluorine at an atomic density of 1% to 20%; and
   a third conductive layer connected to an upper portion of said second conductive layer, and constituting a second wiring.

9. A semiconductor device comprising:
   a first insulating film formed on a main surface of a semiconductor substrate having a MOS transistor;
   a first conductive layer formed on an upper side of said first insulating film, and constituting a first wiring;
   a second insulating film formed on the upper side of said first insulating film and said first conductive film, and having a hole section which is made through to said first conductive layer, and a groove section connected to the hole section;
   a second conductive layer formed in said hole section, a lower portion of said second conductive layer being connected to said first conductive layer; and
   a third conductive layer formed in said groove section, and connected to an upper portion of said second conductive layer, such as to constitute a second wiring,
   wherein at least a part of said second conductive layer and a part of said third conductive layer being made of a tungsten nitride film containing fluorine at an atomic density of 1% to 20%.

10. A method of manufacturing a semiconductor device including a first conductive layer, an insulating layer having a hole section made through to the first conductive layer, and a second conductive layer formed in the hole section and made of a tungsten nitride film containing fluorine, in a reaction chamber to which a first gas containing tungsten and halogen element, and a second gas containing nitrogen are introduced, comprising the steps of:
    setting a flow amount Q1 of said first gas to 10 to 1000 cc/min, a flow amount Q2 of said second gas to 10 to 1000 cc/min, and a flow amount ratio between said first and second gases to $Q1/Q2 \geq \frac{1}{2}$; and
    supplying said first and second gases, the flow amount of each of which is controlled, into said hole section, thereby forming said tungsten nitride film containing fluorine, by a chemical vapor deposition method.

11. A method according to claim 10, wherein, during the formation of said tungsten nitride film by the chemical vapor deposition method, the flow amount ratio is set to $Q1/Q2 \geq \frac{1}{2}$ when a temperature of a subject to be processed is in a range of 250° C. to 400° C., and the flow amount ratio is set to $Q1/Q2 \geq 1$ when a temperature of a subject to be processed is in a range of 400° C. to 600° C.

12. A method according to claim 10, wherein, during the formation of said tungsten nitride film by the chemical vapor deposition method, the flow amount ratio is set to $Q1/Q2 \geq 1$ when a temperature of a subject to be processed is in a range of 250° C. to 400° C., and the flow amount ratio is set to $Q1/Q2 \geq 2$ when a temperature of a subject to be processed is in a range of 400° C. to 600° C.

13. A semiconductor device according to claim 10, wherein said tungsten nitride film used for the formation of said second conductive layer is formed such as to cover a surface of said hole section.

14. A semiconductor device according to claim 10, wherein said second conductive layer is made of said tungsten nitride film and a metal film formed on said tungsten nitride film.

15. A semiconductor device according to claim 14, wherein said metal film is made of a tungsten film.

16. A semiconductor device according to claim 10, wherein said first gas contains $WF_6$.

17. A semiconductor device according to claim 10, wherein said second gas contains at least one of ammonium, hydrazine and an alkylazide compound.

18. A semiconductor device according to claim 10, wherein, during the formation of said tungsten nitride film by the chemical vapor deposition method, inorganic silane gas is also introduced to said reaction chamber.

19. A semiconductor device according to claim 10, wherein, during the formation of said tungsten nitride film by the chemical vapor deposition method, a carrier gas which assists the reduction of said first gas is also introduced to said reaction chamber.

20. A method of manufacturing a semiconductor device including a first conductive layer, an insulating layer having a hole section made through to the first conductive layer, and a second conductive layer formed in the hole section and made of a tungsten nitride film containing fluorine, in a reaction chamber to which a first gas containing tungsten and halogen element, and a second gas containing nitrogen are introduced, comprising the steps of:

rotating a substrate to be processed, placed in said reaction chamber;

setting a flow amount Q1 of said first gas to 10 to 1000 cc/min, a flow amount Q2 of said second gas to 10 to 1000 cc/min, and a flow amount ratio between said first and second gases to $Q1/Q2 \geq 1/4$; and supplying said first and second gases, the flow amount of each of which is controlled, into said hole section, thereby forming said tungsten nitride film containing fluorine, by a chemical vapor deposition method.

21. A semiconductor device according to claim 20, wherein a rotation speed for rotating said substrate to be processed, is set to 500 rpm or higher.

22. A method according to claim 20, wherein, during the formation of said tungsten nitride film by the chemical vapor deposition method, the flow amount ratio is set to $Q1/Q2 \geq 1/4$ when a temperature of a subject to be processed is in a range of 250° C. to 400° C., and the flow amount ratio is set to $Q1/Q2 \geq 1/2$ when a temperature of a subject to be processed is in a range of 400° C. to 600° C.

23. A method according to claim 20, wherein, during the formation of said tungsten nitride film by the chemical vapor deposition method, the flow amount ratio is set to $Q1/Q2 \geq 1/2$ when a temperature of a subject to be processed is in a range of 250° C. to 400° C., and the flow amount ratio is set to $Q1/Q2 \geq 1$ when a temperature of a subject to be processed is in a range of 400° C. to 600° C.

* * * * *